(12) United States Patent
Ortabasi (10) Patent No.: US 8,008,572 B2
(45) Date of Patent: *Aug. 30, 2011

(54) INTEGRATING SPHERE PHOTOVOLTAIC RECEIVER EMPLOYING MULTI-JUNCTION CELLS

(76) Inventor: Ugur Ortabasi, Encinatis, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/606,429

(22) Filed: Oct. 27, 2009

(65) Prior Publication Data

US 2010/0084004 A1    Apr. 8, 2010

Related U.S. Application Data

(60) Division of application No. 10/722,738, filed on Nov. 25, 2003, now Pat. No. 7,619,159, which is a continuation-in-part of application No. 10/151,640, filed on May 17, 2002, now Pat. No. 6,689,949.

(51) Int. Cl.
*H01L 31/042* (2006.01)

(52) U.S. Cl. ...................................... 136/246
(58) Field of Classification Search ............... 136/246
See application file for complete search history.

(56) References Cited

U.S. PATENT DOCUMENTS

| 4,746,370 | A  | * | 5/1988  | Woolf    | 136/246 |
|-----------|----|----|---------|----------|---------|
| 6,057,505 | A  | * | 5/2000  | Ortabasi | 136/246 |
| 6,689,949 | B2 | * | 2/2004  | Ortabasi | 136/246 |
| 7,619,159 | B1 | * | 11/2009 | Ortabasi | 136/246 |

* cited by examiner

*Primary Examiner* — Jeffrey T Barton (57) ABSTRACT

A photovoltaic module for converting laser radiation from a laser emitting light at a wavelength to electrical power is provided. The module comprises: (a) a housing having a cavity of generally optimized closed shape inside the housing, the cavity having an internal surface area $A_s$ and including an opening for admitting the laser radiation into the cavity, the opening having an entrance aperture area $A_i$ that is substantially smaller than $A_s$; and (b) a plurality of photovoltaic cells within the cavity, the photovoltaic cells having an energy bandgap to respond to the wavelength and generate the electrical power.

18 Claims, 4 Drawing Sheets

INTEGRATING SPHERE PHOTOVOLTAIC RECEIVER EMPLOYING MULTI-JUNCTION CELLS

CROSS-REFERENCE TO RELATED APPLICATION

The present application is a Divisional of U.S. Application of Ser. No. 10/722,738, filed Nov. 25, 2003, which issued as U.S. Pat. No. 7,619,159 on Nov. 17, 2009, which is a Continuation-in-Part of U.S. application Ser. No. 10/151,640, filed May 17, 2002, which issued as U.S. Pat. No. 6,689,949 on Feb. 10, 2004, the teachings of which are incorporated herein by reference.

TECHNICAL FIELD

The present invention is related generally to laser power beaming, employing photovoltaic cells, and, more particularly, to a novel photovoltaic module for converting a directed laser beam into electrical power.

BACKGROUND ART

State-of-the-art single junction solar arrays as well as concentrators using single junction solar cells utilize only a limited portion of the available solar spectrum, thereby wasting the remainder of available energy outside of their limited spectral response. The limitation is caused mainly by two basic "photon loss" mechanisms within the cells, namely, (1) loss by longer wavelengths and (2) loss by excess energy of photons. In the former case, photons with energy smaller than the "energy bandgap" or "forbidden gap" $E_g$ (direct bandgap semiconductor) or $E_g - E_{phonon}$ (indirect bandgap semiconductors where $E_{phonon}$ is the phonon quantum of energy) cannot contribute to the creation of electron-hole pairs. In the tatter case, in the spectrum range of interest, one photon generates only one electron-hole pair. The rest of the energy larger than the bandgap is dissipated as heat. Photons with energy $hv \geq E_g$ thus can only use a portion of $E_g$ of their energy for generation of electron-hole pairs. The excess energy raises the temperature of the solar cell and degrades its performance. Thus, even high quality cells with excellent quantum efficiencies, such as GaAs, exhibit relatively modest conversion efficiencies since they cannot respond to more than a relatively small portion of the incident spectrum.

One way of circumventing this limitation is the use of two or more different bandgap cells that are stacked, or monolithically grown, in a vertical manner. Such a multi-junction (MJ) system with appropriately chosen bandgaps can span a significantly greater portion of the incident solar spectrum than achievable with single-junction cell systems. Such multi-junction solar cells are well-known. For example, three-junction cells have been devised that can control a relatively larger portion of the solar spectrum, and are further described below. Because of their potential for very high efficiencies, MJ cells have enjoyed increased interest over the last two decades.

At a NCPV (National Center for Photovoltaics) meeting in Denver, Colo. on Apr. 16-19, 2000, it was reported that triple junction GaInP2/GaAs/Ge concentrator cells developed by NREL (National Research Energy Laboratory) and Spectrolab have achieved 32.3% at 47 suns and 29% at 300 suns (AM1.5, 25C), with an obvious drop of 3.3% (absolute) or 10.2% (relative), indicating one of the many limitations of MJ concentrator systems at higher concentrations. It should be kept in mind that the above-mentioned encouraging achievement with a pulsed solar simulator does not represent a real life situation. Under actual operating conditions, the MJ concentrator system performance can drop more than 12 to 15% (absolute) against the bare cell performance and defeat the use of high efficiency MJ cells. Some of the major concentration-related performance losses in MJ cells are caused by the following shortcomings: absorption of light in the top cells, chromatic aberrations caused by the concentrator optics, flux non-uniformity on the cells, limited heat removal from the top cells, current limitation in the cells, series resistance, shadowing losses due to finger contacts on the cells, and limited acceptance angle for photon incidence on the cells. Most of these limiting factors apply to all conventional concentrator types based on a variety of cells. MJ cells, however, are more vulnerable to most of these performance-limiting factors.

The relative deterioration of MJ cells becomes worse as the number of junctions increases. Several authors in the field have predicted that for vertically stacked or monolithically-grown systems, limited improvements are expected beyond triple-junction cells. A recent press release by Boeing (Spectrolab) on Aug. 15, 2001, confirmed that a triple junction cell developed by Spectrolab and NREL has reached a conversion efficiency of 34% (a world record at that time) at 400×. That appears to be very much the limit of three-junction cells. Four-junction cells are predicted to be able to reach upper 30% and lower 40% efficiencies. Theoretical studies have shown that to achieve this kind of efficiency level, a four-junction cell system requires a 1 eV bandgap III-V cell that meets all requirements including: optical, thermal, and electronic issues involved. In spite of extensive efforts, this material remains elusive.

Another shortcoming of the monolithic MJ cells lies in the limitation of complementary bandgap cell materials with matching lattices. In vertically-grown MJ cells, all the adjacent "sub-cells" must have matching or slightly mis-matching lattices for proper performance. Thus, even the best bandgap matched sub-cell cannot result in a multi-junction cell if their lattices mis-match. This requirement narrows down significantly the available set of sub-cells that could be used.

These apparent limitations represent a formidable bottleneck in the development of high and very high efficiency (and therefore cost-competitive) concentrator systems in the near future. According to analytical studies, ideal four bandgap cell systems utilizing a new 1 eV material can improve the solar to electricity conversion efficiency over 48% at 500 suns. Even at a cost of $250/Watt for such a system, the effective cell system cost for a 500× flux concentrator can be as low as $0.50/Watt. At this cost level, the concentrators would be ahead of the long range goals of the Department of Energy for PV flat plate technology (installed system cost of $1.00/Watt to $1.50/Watt by the year 2030), if the balance of concentrator system could be built for $0.50/m$^2$ to $1.00/m$^2$. Thus, very high cell and system efficiencies are paramount to achieve the long term cost goals for photovoltaics in general.

In the late 1990s, NASA and JPL scientists proposed an alternative technique, called "Rainbow", to circumvent the problems of vertical MJ systems and improve the performance of multi bandgap cell systems. Their method is to split the solar spectrum into several frequency bands and focus each frequency band onto separate cells with corresponding energy bandgaps. The Rainbow multi-bandgap system represents a combination of solar cells, concentrators, and beam splitters. The use of separate discrete cells offers the widest possible scope of semiconductor choices. Based on data for "real" cells and optical components, Rainbow was expected in 1997 to convert over 40% of incident solar energy to electricity at the system level.

To the knowledge of the present inventor, this concept has never come to a closure, presumably due to extreme difficulties encountered with the associated optics. In addition, this space system would only have a concentration ratio of a maximum of 20×, i.e., much lower than the 500× or more to reduce the effective cell cost dramatically. A thorough literature search has shown that in the past, the very promising method of spectral splitting and simultaneous use of discrete solar cells with different bandgaps has never reached its potential capacity and the technology was never exploited fully. The parent application to the present application represents a straight-forward approach to achieve break-through performance levels and with it to rapidly lower the cost of solar energy to competitive levels.

To address the large demand for noise-free and safe power transmission, without the use of electrical wiring, several new technologies are being introduced. The two major approaches are: (1) microwave and millimeter wave beaming and (2) optical fiber light transmission in conjunction with optically powered, sensors, transducers and data communications equipment. At the receiving end, microwaves and millimeter waves are converted into electricity via highly tuned phased array antennas. In the case of optical fiber power transmission, the conversion of light into electricity happens via a photovoltaic power converter, which is basically a slightly modified solar cell.

The conversion of beamed microwaves and millimeter waves into electric power is highly efficient. However, concerns with the potential hazardous impact of high intensity beams and the strong beam divergence limit the area of applicability of such power-beaming technologies to high altitudes and space. Optical fiber power transmission is distance- and power-limited due to optical absorption in the fiber and light input/output coupling losses. Most of the reported fiber optics power transfer applications are limited to local area networks (<<1 km) of power levels less than 1 watt and for the most a few microwatts. Thus, there is a need for a power beaming technology that can provide a wireless electric power source ranging from 1 watt to tens of kWatts and can be beamed from, say, 10 meters to several kilometers and beyond. Such high laser power levels are now available, due to emerging laser technologies such as chemical oxygen-iodine lasers (COIL) that are scalable up to 40 kW at a wavelength of 1.315 microns.

More recently, proposals have been made to convert coherent light to electricity. Such applications have been termed. "Laser Power Beaming" (LPB). LPB technology uses the properties of coherent light to transfer power between two locations without the need of any material or man-made medium. Thus, LPB is extremely fast and weightless. Over the last decade, total energy efficiencies for some lasers have improved significantly (40% and up) and reliable operation of high power lasers over long periods of time has been demonstrated in real life applications. The most efficient method of converting beamed laser power into electricity at the receiving end is the use of photovoltaic (PV) cells. As a result of recent research and development efforts on solar PV cell technology, solar-to-electricity conversion efficiencies as high as 36% has been achieved at 500×AM1.5 suns or about 50 W/cm$^2$. Efficiencies for monochromatic light, as it is the case with LPB, are expected to be much higher. Research efforts in the field of thermo-photovoltaics (TPV) made it possible to develop new photovoltaic materials that are responsive in the near infrared range of the electromagnetic spectrum, that would, for example, operate at 40 to 45% efficiency at 1.315 wave length of the COIL lasers mentioned above. Such a TPV cell, for example, GaInAsSb/AlGaAs, can be used effectively with the COIL lasers mentioned above.

As an aside, it is important to note that in the past, integrating sphere systems have been used to measure, control, and monitor laser and laser diodes. However, to the knowledge of the inventor, the PowerSphere approach disclosed and claimed herein is the first disclosure that teaches how the integrating sphere concept can be exploited to convert beamed laser energy into electric power.

DISCLOSURE OF INVENTION

In accordance with the present invention, a photovoltaic module, or PowerSphere, for converting coherent laser radiation from a laser emitting light at a wavelength into electrical power is provided. The module comprises:
(a) a housing having a cavity of generally optimized closed shape inside the housing, the cavity having an internal surface area $A_s$ and including an opening for admitting the laser radiation into the cavity, the opening having an entrance aperture area $A_i$ that is substantially smaller than $A_s$; and
(b) a plurality of photovoltaic cells within the cavity, the photovoltaic cells having a bandgap energy to respond to the wavelength and generate electrical power.

Further in accordance with the present invention, a combination of a reflecting concentrator and the photovoltaic module is provided. The reflecting concentrator comprises:
(a) a primary concentrator for intercepting and concentrating the laser radiation, and
(b) a secondary concentrator for receiving the concentrating said laser radiation from the primary concentrator and further concentrating the laser radiation.

The photovoltaic module is positioned for receiving the further concentrated laser radiation from the secondary concentrator.

The PowerSphere of the present invention has the potential to yield laser-to-electricity conversion efficiencies from 60% to 70%.

Other objects, features, and advantages of the present invention will become apparent upon consideration of the following detailed description and accompanying drawings, in which like reference designations represent like features throughout the FIGURES.

BRIEF DESCRIPTION OF THE DRAWINGS

The drawings referred to in this description should be understood as not being drawn to scale except if specifically noted.

BEST MODES FOR CARRYING OUT THE INVENTION

Reference is now made in detail to a specific embodiment of the present invention, which illustrates the best mode presently contemplated by the inventor for practicing the invention. Alternative embodiments are also briefly described as applicable.

The embodiments herein are directed to an integrating sphere photovoltaic (PV) receiver, or module, for converting laser light into electric power. The receiver is called a "PowerSphere".

The basic concept of the PowerSphere is based on a photovoltaic cavity converter (PVCC) module that has been designed for a concentration in the range of 500 to over 1000 suns and a power output range of a few kilowatts to 50 kW$_e$ when combined with a primary dish and a secondary concentrator. That PVCC module is disclosed and claimed in the above-identified parent application, now U.S. Pat. No. 6,689,949. The PVCC module herein is expected to find use in, for example, DOE's Concentrating Solar Power (CSP) program to develop systems in the 1 to 5 kW$_e$ and 10 to 30 kW$_e$ size ranges based on reflective optics. A typical power range is about 30 to 50 kiloWatts. Connecting a plurality of such modules together in a power plant permits power generation up to several hundred megaWatts.

The PVCC module is based on advanced single junction cells, including III-V cells, for example, manufactured by EMCORE Photovoltaic (Albuquerque, N. Mex.). The PVCC module is based on reflective optics, and is capable of delivering power in the range of 0.5 to 3 kW$_e$ at concentrations in the range of 100 to 500× when optically coupled to the exit aperture of the second reflective stage (CPC) currently located at HFSF. According to NREL specifications, this second reflective stage provides an average flux density of 20,000 AM1.5 suns at its exit aperture. The overall targeted module conversion efficiency for near- and midterm is to exceed 33% to 45%, respectively.

The PVCC module is a light-trapping cavity equipped with internal solar cells of different energy bandgaps. A unique system of Rugate filters is applied to the cells to "split" the solar spectrum by the method of selective energy extraction (spectral screening). This novel conversion device actually defocuses to a certain extent the pre-focused solar flux entering the cavity in a controllable manner by determining the diameter of the sphere.

Figure 1:
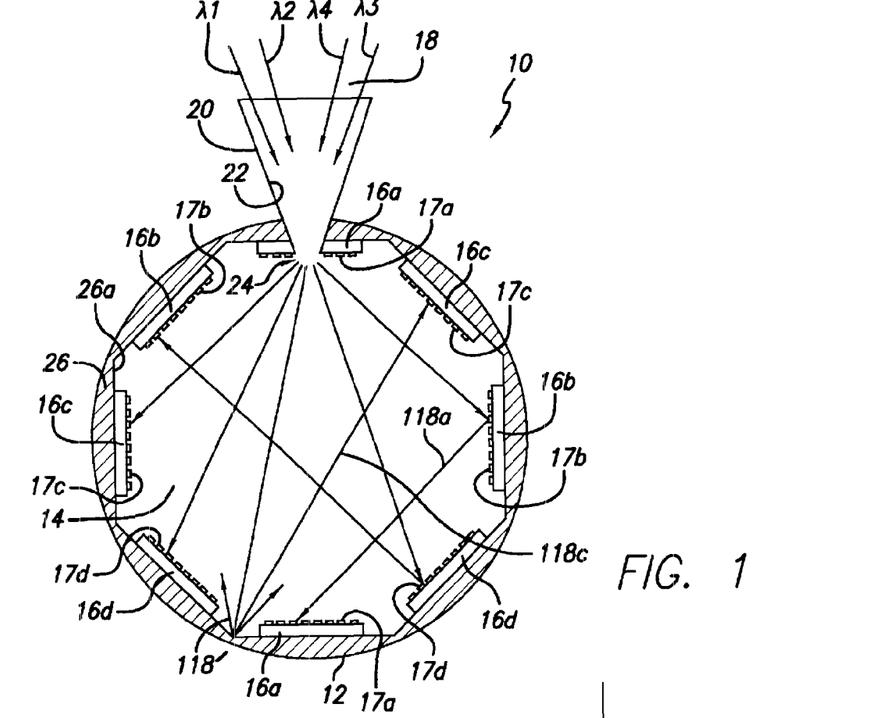
FIG. 1 is a cross-section view, in schematic, depicting the basic principles of the multi-bandgap Photovoltaic Cavity Converter (PVCC)

FIG. 1 illustrates the principles of the Photovoltaic Cavity Converter (PVCC). In FIG. 1, the PVCC 10 comprises a housing 12 having an internal cavity 14 that is generally spherical, but may be some other optimized closed shape. By an "optimized closed shape" is meant, for example, a generally spherical shape, a generally ellipsoidal shape, or a generally conical shape. In general, any shape that is closed upon itself is useful. However, a generally spherical shape is preferably employed. The closed shape is optimized to promote an efficiency that is as high as is possible ("optimized") in the collection of photons.

The cavity 14 contains therein a plurality of solar cells 16, grouped into voltage-matched cell strings of different energy bandgaps. Simultaneous spectral splitting occurs by means of selective transmission and/or reflection of the photons by matching (conjugated) Rugate filters 17 associated with the cells 16. Alternatively, a combination of Rugate filters and stack interference filters may be used as filters 17. In an exemplary embodiment, there are four groups of solar cells, denoted 16a, 16b, 16c, 16d, although it will be appreciated by those skilled in this art that less than four groups or more than four groups of solar cells may be employed. In a preferred embodiment for PVCC, four or more cell types are employed, which, when properly selected, is expected to result in higher efficiencies.

Each group of solar cells 16 is responsive to a different portion of the solar spectrum 18. Examples of suitable solar cells that are responsive to different portions of the solar spectrum are discussed below.

The light 18 entering into the spherical cavity 14 is first pre-focused by a primary concentrator (dish) (not shown in FIG. 1) and then by a second-stage, or secondary, concentrator 20 that has its inner surfaces 22 mirrored. An example of such a second-stage concentrator is disclosed in U.S. Pat. No. 6,057,505, issued May 2, 2000, to the present inventor. The second-stage concentrator 20 has a Bezier optimized contour to provide a combination of maximum acceptance angle, highest concentration, and minimum height.

After passing through the second-stage concentrator 20, the light 18 then enters the spherical cavity 14 through a small entrance aperture 24 (similar to an integrating sphere) and is defocused to the desired flux concentration by the choice of the diameter of the sphere 12. The escape probability of the trapped photons can easily be kept below a few percent by making the aperture 24 small enough as compared to the surface area of the interior wall 26. The highly reflective interior surface 26 of the sphere 12 is lined with discrete single junction cells, including III-V solar cells 16 of different energy bandgaps and/or IV solar cells, such as Si and/or Ge. Other types of cells are also permissible if they meet the performance criteria.

Photons, once trapped by the cavity 14, undergo several bounces from the cells 16 and cavity wall 26 until they are either (1) absorbed to generate waste heat or (2) transmitted into the appropriate cells to generate electron-hole pairs with a high probability or (3) escape back to space through the aperture 24. The probability of escaping through the aperture 24 is dependent to a first approximation upon the ratio $A_i/A_s$, where $A_i$ is the diameter of the aperture and $A_s$ is the diameter of the sphere 12. A small $A_i$ and a large $A_s$ means a small escape probability. Preferably, the ratio of $A_i:A_s$ is less than 0.01.

As shown in FIG. 1, beam 18 is depicted as comprising photons at four different wavelengths $\lambda_1$, $\lambda_2$, $\lambda_3$, and $\lambda_4$. Each of the solar cells 16a, 16b, 16c and 16d are each responsive to a different wavelength. In this example, $\lambda_1$ is associated with solar cell 16a, $\lambda_2$ is associated with solar cell 16b, etc.

For example, diffusely-reflected $\lambda_4$ photons, denoted, at 118', are reflected from the cavity wall 26. A $\lambda_3$ photon, denoted 118c, enters a matching $\Delta\lambda_3$ solar cell 16c. As another example, $\lambda_1$ photon, denoted 118a, is rejected by a $\Delta\lambda_2$ solar cell 16b, but is absorbed by solar cell 16a.

A. Photon Capture by the Spherical Cavity (Photon Escape Probability)

Figure 2:
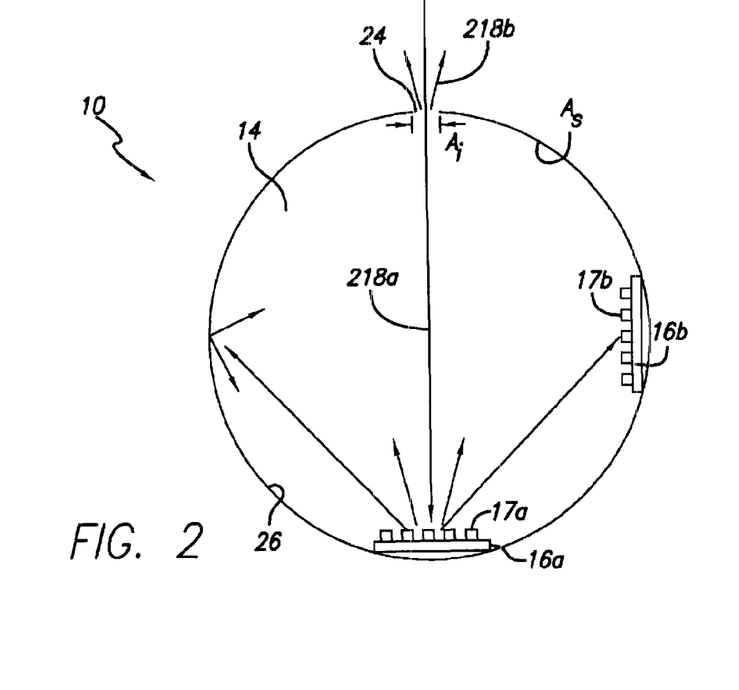
FIG. 2 is a view similar to that of FIG. 1, depicting the escape probability of a photon representing a discrete frequency band from the PVCC.

The highly concentrated beam (photons 18 in FIG. 1) from the secondary concentrator 20 is injected into the spherical cavity 14 and is trapped within the boundaries of the cavity wall 26. (In actuality, the beam 18 becomes divergent or defocuses after entering the cavity 14 at aperture 24.) The escape probability of a trapped photon representing a frequency band is, to a first degree, proportional to the ratio of entrance aperture area ($A_i$) to the total interior surface area ($A_s$) of the sphere. FIG. 2 illustrates the escape probability of a photon representing a discrete frequency band.

The incoming flux of photons is represented by 218a and the outgoing flux by 218b. The entrance aperture 24 has area $A_i$. The photon 218a can enter a solar cell 16a or be reflected off its surface and enter another solar cell 16b, or the photon can be reflected off the surface of the first solar cell 16a and in turn reflected off the interior surface 26 or reflected back through the entrance aperture 24. A Rugate filter 17, for example, 17a, is shown associated with each solar cell 16, for example, 16a. The Rugate filter 17 may be formed directly on top of the solar cells 16 or deposited on a fused glass cover and may be cemented to the cell or spaced apart from the solar cells.

Using the integrating sphere radiance equation, it can be shown that for a given frequency band the escape probability for a photon within that band is given to a first order by:

$$Q_{out}/Q_{in} = A_i/A_s \{r(1-f)/1-(1-f)\},$$

where $Q_{out}/Q_{in}$ is the ratio of the outgoing flux 118b to the incoming flux 118a, $f=(A_i+A_c)/A_s$, $A_s$=total interior surface area of the sphere 14, $A_i$=area of the entrance aperture 24, and $A_c$=total surface area of the cells 16 in the given frequency band, for example, cell 16a. This simplified equation assumes that the cells 16 (i.e., cells 16a, 16b, 16c, 16d) with bandgaps outside the frequency band have the same reflectance as the highly reflective sphere coating 26a (discussed in greater detail below). Now consider a sphere 14 of 10 cm diameter with an entrance aperture of 1.4 cm in diameter. The interior of the sphere is 20% occupied with cells of a given bandgap. All cells 16 are coated with Rugate filters 17 with complete (100%) transmission and reflection characteristics, respectively. The calculated escape probability becomes then about 1.2%. This probability can be reduced by choosing a larger diameter for the sphere 14. This, however, will lower the overall concentration ratio (see below) and increase the absorption of the photons by the uncovered cavity wall.

B. The Choice of Diffuse Reflector

The quality of the diffuse reflector 26a on the wall 26 of the cavity 14, shown in FIG. 1, is important. It is directly related to reflection losses, flux uniformity, and sphere multiplier factor M. The stability of the reflector under high levels of flux and possible, accidental temperature runaways is also very important as these may change the reflectance.

Preliminary evaluation of reflector materials 26a resulted in the selection of "space-grade" SPECTRALON that combines very high-reflectance with an extremely lambertian reflectance profile. It also has excellent low outgassing features. SPECTRALON, which is manufactured by Labsphere (North Sutton, N.H.), is a thermoplastic resin with special pigments added that can be machined into a wide variety of shapes for the construction of optical components. The material is chemically inert and is thermally stable up to 400° C. Further details of this material are disclosed and claimed in U.S. Pat. No. 5,763,519, entitled "Diffusively Reflecting Sintered Fluorinated Long-Chain Addition Polymers Doped with Pigments for Color Standard Use", and issued to A. W. Springsteen on Jun. 9, 1998, incorporated herein by reference.

SPECTRALON reflectance material gives the highest diffuse reflectance of any known material or coating over UV-VIS-NIR (ultraviolet-visible-near infrared) region of the spectrum. The reflectance is generally >99% over a range from 400 to 1500 nm and >95% from 250 to 2500 nm. The material is also highly lambertian at wavelengths from 250 to 10,600 nm. A "lambertian" surface is a perfectly diffusing surface having the property that the intensity of light emanating in a given direction is proportional to the cosine of the angle of the normal to the surface (lambertian cosine law). A material such as SPECTRALON obeying this law is said to be an isotropic diffuser that has the same radiance in all directions. "Highest diffuse reflectance" means the known highest reflectance of 99.1% over the solar spectrum. Another suitable reflectance material for use as the coating 26a in the practice of the present invention is barium sulfate.

C. Integrating Sphere Photovoltaic Receiver

In accordance with the present invention, since the integrating sphere PV receiver, or PowerSphere, is intended for a single wavelength laser source, then only one type of solar cell, sensitive to that wavelength, need be used. For the same reason, Rugate, or other spectral filters, are unnecessary.

Figure 3:
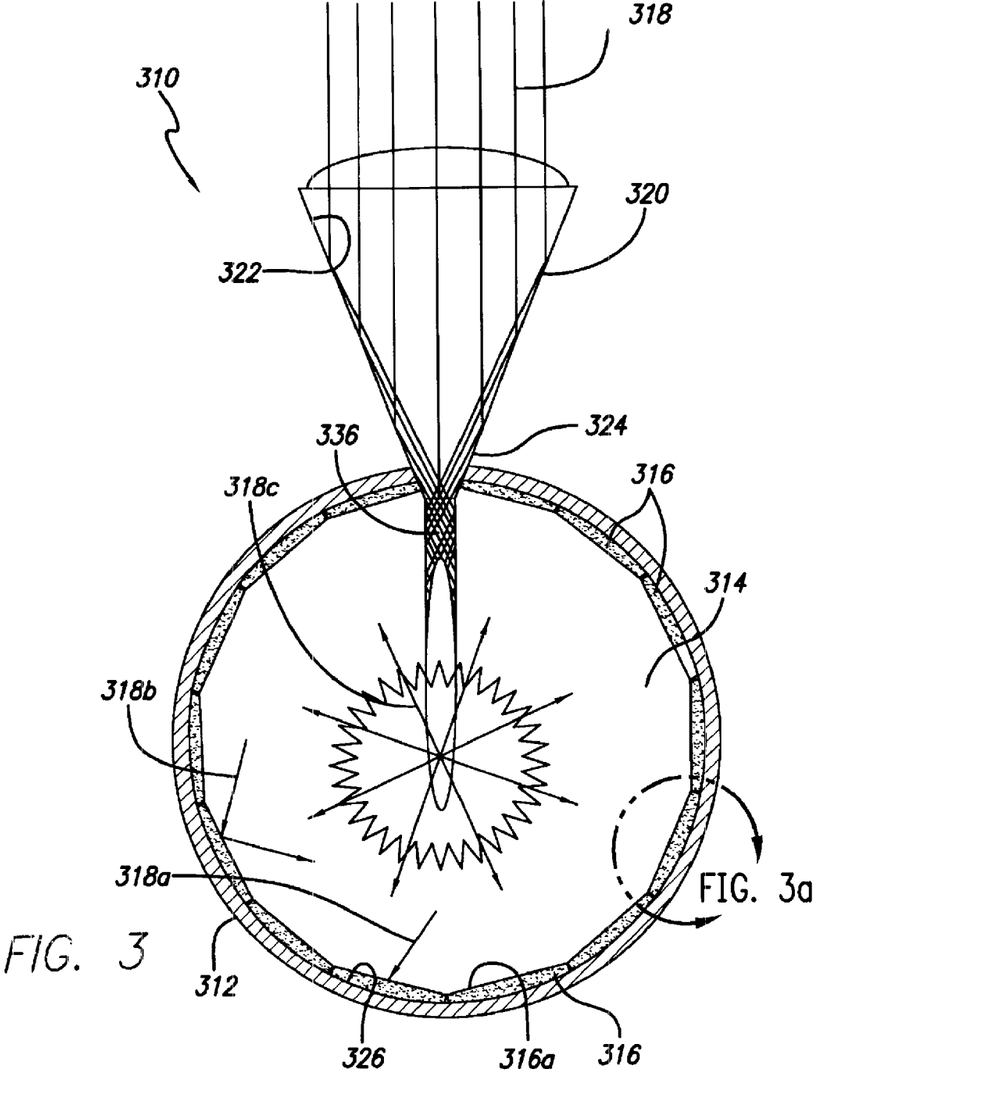
FIG. 3 is a cross-section view, similar to that of FIG. 1, depicting the principles of the single bandgap integrating sphere photovoltaic receiver (Power-Sphere) operation with a dielectric light injector.

The laser-to-electricity conversion approach, or PowerSphere, is depicted in FIG. 3. As with the PVCC 10, the PowerSphere 310 includes an optimized closed shape, preferably, a spherical cavity 314 with a small port 324 for insertion of light 318 and an array of photovoltaic cells 316 that almost completely cover the interior wall 326 of the cavity. A secondary, dielectric concentrator, or light injector/booster, 320 with an extractor rod 336 serves the same function (i.e., boosting and injecting pre-focused laser beam into the sphere 310) as the secondary concentrator 20 discussed above. However, the extractor rod 336 evenly distributes the light in all directions inside the cavity 314. As with the secondary concentrator 20, the inner surfaces 322 of the secondary concentrator 320 may be mirrored. Preferably, the secondary concentrator 320 is a non-imaging, compound parabolic of hollow design, as disclosed in the above-referenced U.S. Pat. No. 6,057,505.

The individual cells 316 are interconnected with each other in a certain fashion (in parallel and in series) to achieve the voltage and current levels for the required electrical power output. The laser light 318 enters the cavity 314 via the dielectric concentrator 320. As shown in FIG. 3, the E-rod 336 fits exactly the light entry port 324 of the sphere 310. The function of the E-rod 336 is first to guide the light 318 towards the center of the cavity 314 and then to emit the photons 318 uniformly in all directions. This angular isotropy is required to achieve the best possible flux uniformity before the photons 318 experience their first reflection at the cavity wall 326. Strong non-uniformities in the flux distribution have a degrading effect on the performance of the array of the photovoltaic cells 316.

Dielectric, non-imaging, secondary concentrators based on total internal reflection are abbreviated as DTIR. This type of refractory secondary was introduced in the mid-1970s to enhance the performance of reflective, non-imaging, two-stage concentrators for larger acceptance angle at a given concentration ratio and to reduce the focal distance of the two-stage concentrator system. In addition, they proved to have higher throughput than refractive systems.

An E-rod 336 works by multiple reflections of light rays at increasingly increasing angles along its length, causing each ray to eventually fail TIR and refract out of the E-rod into a lower index medium. In the case of the PowerSphere 310, the low index medium is air and the isotropic distribution of the rays are achieved by facets in a certain pattern on the surface of the E-rod 336. The impact of the use of the E-rod 336 is the elimination of the lambertian material 26a (e.g., SPEC- TRALON). In the PowerSphere design, the photons 318 are distributed evenly and the photovoltaic cells 316 see a uniform flux to start with.

Figure 3A:
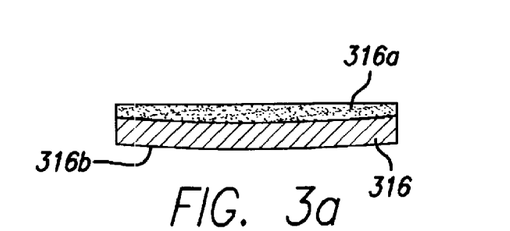
FIG. 3a is an enlargement of a portion of FIG. 3.

The photovoltaic cells 316 are carefully selected with regard to their quantum efficiency to optimize the conversion of the monochromatic light 318 of the chosen laser. The best conversion is achieved when the laser wavelength coincides with the peak of the quantum efficiency response. For laser power beaming applications, the cell design must take into consideration the very high flux concentrations that are involved. The required cell design features for laser power beaming are achieved by proper doping of the cells 316 and by enhancing the top metal contacts (grid fingers) (not shown) of the cell in order to mitigate the rapidly growing series resistance as the flux density increases. As is explained below, the PowerSphere concept allows much wider and denser grid fingers than the conventional flat plate PV receivers without the associated "shadowing" losses. Further, an anti-reflective coating 316a may be formed on the front surface of the photovoltaic cells 316, as shown in FIG. 3a. Thus, in principle, the PowerSphere can reach higher efficiencies than possible with the flat plate PV receivers at high flux densities.

The photovoltaic cells 316 may be provided with a thin mirrored back surface 316b for reflecting photons not absorbed by the bulk of the cell. Such reflected photons, however, are absorbed by another PV cell 316 inside the cavity 314. Thus, the photon utilization factor is improved.

Figure 4:
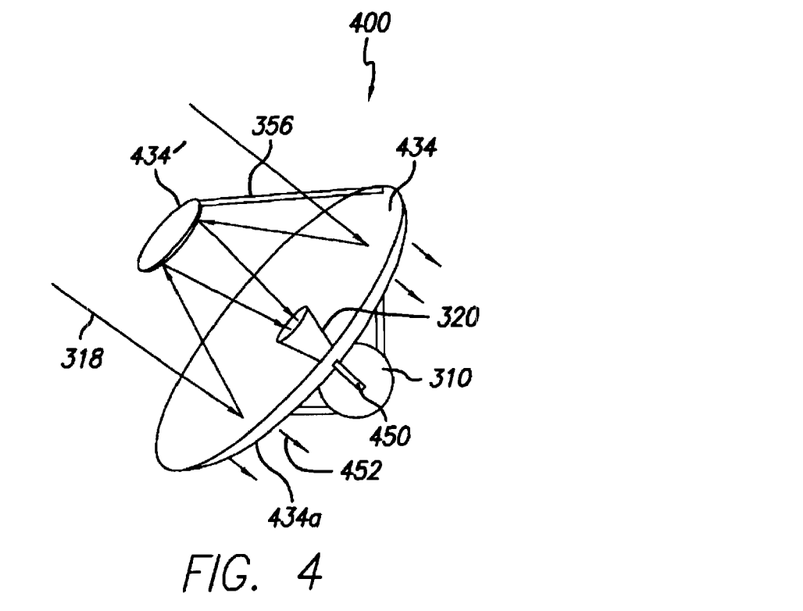
FIG. 4 is a schematic diagram, depicting a Cassegranian concentrator, coupled to the PowerSphere, to accommodate beam broadening for long range power beaming applications for both space and terrestrial use.

The PowerSphere is a novel technology that aims at the highest laser-to-electric power conversion efficiency for power beaming applications. Modified versions of the PowerSphere concept are applicable to both space and terrestrial applications. For example, NASA, the Air Force, and others are intensively exploring utilization of laser power beaming in space. All these applications require photovoltaic laser beam receivers that are highly efficient and reliable. FIG. 4 shows the principles of a lightweight Cassegranian/PowerSphere for space applications, although such a configuration could also be suitably employed, with minor modifications, for terrestrial applications.

Specifically, as shown in FIG. 4, a laser power beam 318 is intercepted by a reflecting concentrator 400, e.g., a Cassegranian concentrator, comprising a primary concentrator 434 that is preferably parabolic in shape and also serves as a heat radiator. A secondary concentrator 434' that is preferably hyperbolic in shape is located at the focus of the primary concentrator 434, and directs the laser light 318 into the light injector/booster 320, which can be either refractive or reflective. The light injector/booster 320 serves essentially the same function as the secondary concentrator 20, as described above. The secondary concentrator 434' is suspended above the primary concentrator 434 by telescopic arm 456. The light 318 then enters the integrating sphere photovoltaic receiver 310 through the injector/booster 320, as described above.

A loop heat pipe system designed for zero gravity space environment, shown at 450 and described in greater detail in above-referenced U.S. Pat. No. 6,689,949, removes waste heat from the sphere 310 and transfers it to the back surface 434a of the primary concentrator 434. The rejected heat 452 is radiated into space (or the surrounding environment) by the primary concentrator 434. The primary concentrator 434, a parabolic dish, that intercepts the somewhat broadened laser beam, is made of highly conductive carbon fiber composite for excellent surface thermal diffusivity, stiffness and lightweight. A non-limiting example of such a highly conductive carbon fiber is K1100, available, for example, from AMOCO. The back-surface 434a of the primary concentrator 434 is highly emissive to facilitate good radiative waste heat rejection into space or surrounding environment.

Figure 5:
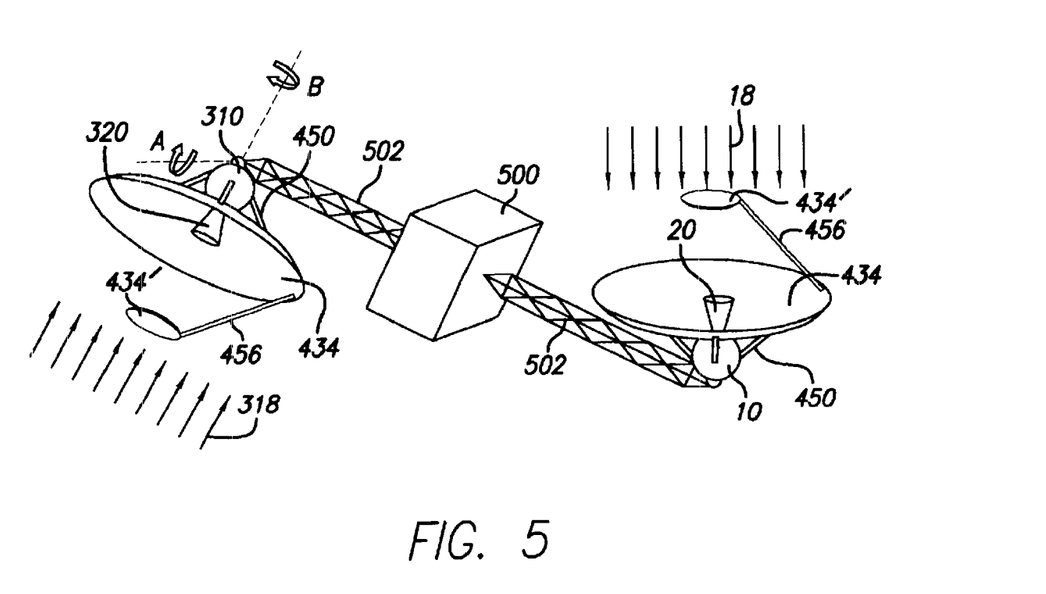
FIG. 5 is a schematic diagram, depicting a deployed space vehicle equipped with a combination of laser and solar power modules.

FIG. 5 illustrates how a space vehicle 500 can be equipped with both a laser PV module 310 and a solar PV module 10 if the missions power demand requires two independent power sources. The two modules 10, 310, are deployed from the space vehicle 500 by deployment booms 502. At least the laser PV module 310 has rotational capability about axes A and B to optimize interception of the laser power beam 318. In this latter connection, the back surface of the secondary concentrator 434' (facing the laser beam 318 or sun's rays 18) may be provided with centering means (not shown) to align the concentrator 434 to incoming radiation 18, 318. An example of one such means is disclosed in U.S. Pat. No. 4,330,204, entitled "Self-Aligning Laser Communicator Utilizing Reciprocal Tracking" and issued to Richard A. Dye on May 18, 1982, the contents of which are incorporated herein by reference. In essence, a quadrature detector, composed of four equal segments, receives radiation. So long as all four segments generate the same current, no further alignment is necessary. An imbalance in current is indicative of mis-alignment (off-center position) of the beam, and the information can be used to rotate the PV module 310 about axes A and/or B to bring the concentrator 434 into alignment.

It is also possible to construct a "dual purpose" PVCC that can convert both direct solar radiation and a directed laser beam efficiently into electricity. Such a PVCC would find application in certain space missions where the satellite must fly through an eclipse during which no solar radiation is available. However, a laser based on a space platform at a suitable distance and position can provide the power during the eclipse period. Such a dual purpose PVCC may contain a combination of multi-junction cells and single junction cells, such as InGaP/GaAs (multi-junction), silicon (single junction), and InGaAsP/InGaAs (multi-junction). The dual purpose PVCC would essentially combine the solar cells 16a-16d with filters 17 of FIG. 1 and the photovoltaic cells 316 of FIG. 3 in a single cavity 14 or 314. The solar cells 16a-16d would be selected to span at least a portion of the solar spectrum.

There is also a growing need for terrestrial power beaming with lasers for a multitude of applications where electric power cables cannot be used or are not practical and also the use of batteries is limited. Examples include: energy transfer to rotating systems or flying unmanned drones (see FIG. 6), potentially explosive surroundings, facilities for radioactive and other hazardous materials, remote robotics, power supply to switches, remote sensor applications with high power demand, high power electronic systems (e.g. telemetry equipment as shown in FIG. 7) susceptible to electromagnetic interference (EMI), unmanned surface maritime vessels, offshore oil exploration, etc.

Figure 6:
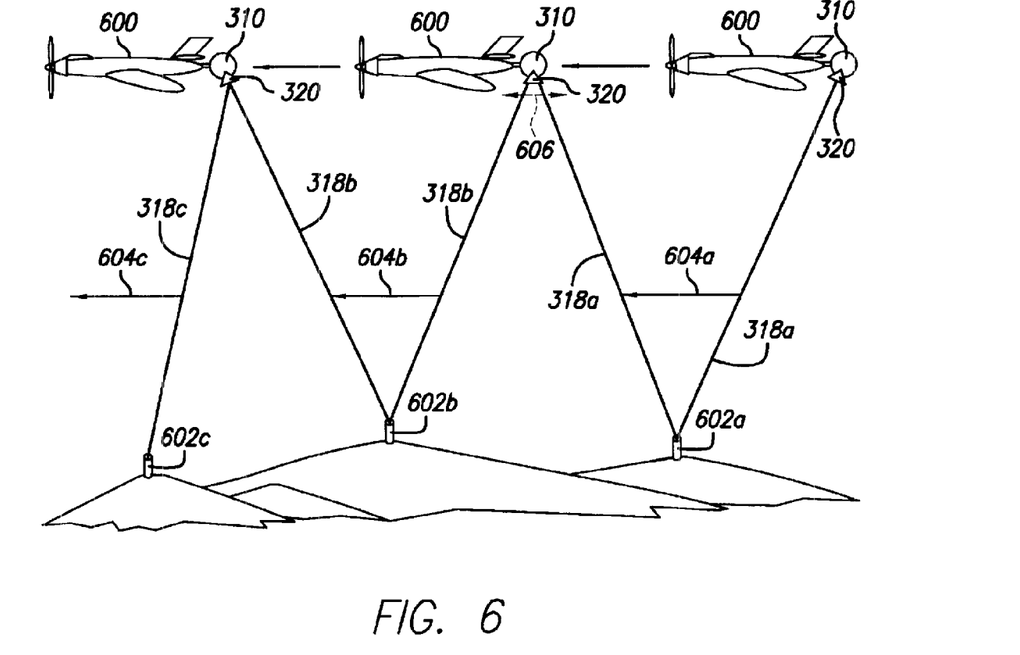
FIG. 6 is a schematic diagram, depicting a sequence of a continuous flight drone powered by laser beaming.

In FIG. 6, an unmanned drone 600, such as used for border surveillance, is shown moving across the page. The drone 600 is fitted with an integrated sphere photovoltaic receiver 310, such as described above. A ground-based laser network, comprising a plurality of lasers 602a, 602b, 602c emitting laser radiation 318 that is receivable by the PV receiver 310, is established over an area to be patrolled by the drone 600. For improved reception of the laser power beam 318, the PV receiver 310 could be mounted on gimbals (not shown), which would permit the drone 600 to track the laser power beam 318 as the drone moves from a first laser 602a to a second laser 602b to a third laser 602c. It will be appreciated that there is a beam transfer range 606 as the drone "passes off" from one laser, e.g., 602a, to another laser, e.g., 602b.

For an unmanned drone 600 flying at an altitude of 35,000 feet, the distances between each two beam transfer range (604a, 604b, 604c) would be about 13.4 miles, if the traveling power beam 318 is allowed to sweep an angular distance from −45° to +45° around a point (zenith) directly overhead on a given laser beam source 602 in the laser network that covers a specified area. In this configuration, the distances between neighboring laser sources 602 would be also about 13.4 miles.

Figure 7:
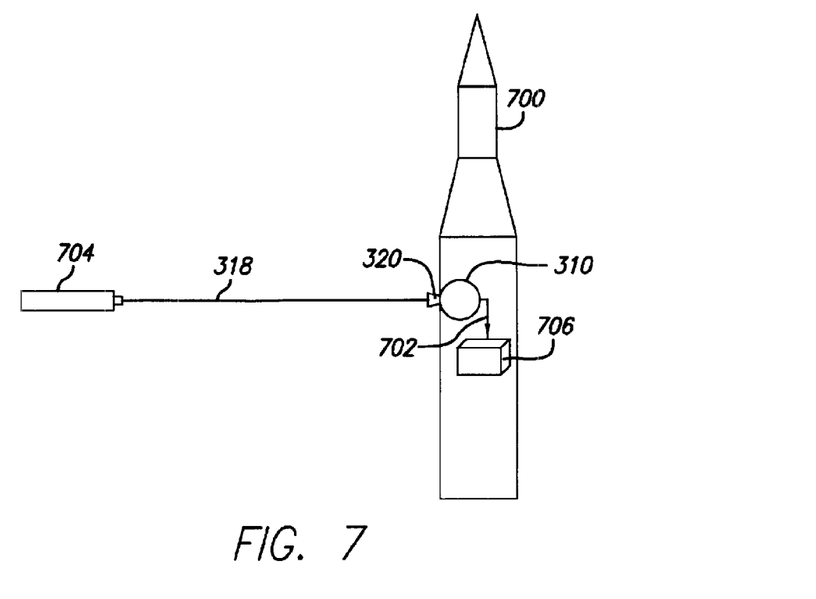
FIG. 7 is a schematic diagram, depicting the use of the PowerSphere as a source of DC power, free of electromagnetic interference (EMI).

In FIG. 7, a missile 700 is equipped with the PowerSphere 310 of the present invention, which provides DC power along line 702. The PowerSphere 310 receives light 318 from a high power laser 704. The DC power provides a source of power to telemetry equipment 706 in the missile 700, where, for example, the equipment is undergoing long duration ground testing and it is required that the power be free of electromagnetic interference.

High power lasers have been under intense investigation as a directed energy source. The U.S. Government and industry have a long standing interest in developing high-power lasers for a variety of applications including materials processing, isotope separation, nuclear fusion, long range sensing and long range communications and other defense activities. Key development goals are high brightness and high efficiency. Laser technologies that are in an advanced stage of development include chemical oxygen-iodine laser (COIL), photolithic iodine lasers, carbon dioxide lasers, diode pumped solid-state lasers, and high power semiconductor diode lasers. High power semiconductor diode Laser technology has some definite advantages over other types of lasers because of their extremely small size and efficiency (potentially up to 70%). Chemical oxygen-iodine lasers have also been proven to be scalable up to 40 KW with improved efficiency.

In the past, several semiconductor cell materials have been studied by NASA in conjunction with PV converters for laser power beaming. The most rigorously studied PV materials are Si, GaAs, InP, Ge, and certain III-V cells, including InGaP, InGaAs, and InGaAsP. All these cells have reached a mature technology state and are commercially available. Silicon cells, although not the most efficient of them all, are the best initial choice because of their reliability, availability, and low cost.

Over the last decade "bandgap engineering" studies have opened up the possibilities to a new era of bandgap "tunable" semiconductors. Some examples are recently discovered indium/gallium alloys and quantum-well systems. Once these technologies are fully developed, it will become possible to closely match a given laser frequency with the quantum efficiency peak of a tunable PV cell. This is particularly important for the near-infrared range where COIL lasers with good atmospheric penetration can be matched with the recently developed photovoltaic GaAlInAsSb alloys with bandgaps ranging from 0.52 to 0.55 eV.

D. Expected Laser-To-Electric Power Efficiencies with PowerSphere:

Some fiber optic driven photovoltaic power converters are already on the market. These devices are quite efficient (about 40%) but their power capability is very low (about a few mW). The Power/Sphere system disclosed herein, however, involves a high power laser/PV converter that can generate electric power ranging from few watts to tens of kilowatts. As mentioned above, such high power concepts have been mostly of interest to NASA and DOD, and the bulk of the available data comes from these sources.

Theoretical modeling by NASA indicates that by tuning the wavelength of a laser to 840 nm, a power beam system based on GaAs can achieve quantum conversion efficiencies approaching 60%. The highest literature cell efficiency reported under selective illumination is 59% for the AlGaAs/GaAs hetero-junction cell, at laser input intensities up to 54 $W/cm^2$. The integrating sphere receiver of the present invention is expected ultimately to reach efficiencies approaching 70%. This improvement is due to minimized series resistance at very high flux densities and the photon recycling process in the cavity, as explained below.

E. PowerSphere vs. Flat Plate PV Receivers:

There are fundamental differences between the operational principles of PowerSphere 310 and flat plate PV receivers for concentrator systems. These are briefly highlighted below:

1. Photon Utilization:

Incident photons (laser beam) on a flat plate PV receiver either enter the solar cells or are reflected from the active cell surface and from the top surface metallization (grid fingers, bus-bar, etc.). Photons striking the non-active areas between the cells are either absorbed or reflected. Reflected and absorbed photons are lost for the conversion process and can no longer contribute to the photocurrent. These losses are substantial in the case of high flux densities such as the laser power beaming require (50 $Watts/cm^2$ or higher).

In contrast to flat plate receivers, the PowerSphere 310 shown in FIG. 3 traps almost 99% of the photons 318 that enter the cavity 314. Reflected photons 318b return back into the cavity 314 and are recycled. A high reflectivity material (not shown), such as discussed above, e.g., SPECTRALON, covering the non-active areas of the interior cavity wall 326 (much like coating 26a in FIG. 1 above), also reflects photons 318 striking the areas between the PV cells 316. This photon recycling mechanism leads to a higher photon utilization factor and consequently to higher efficiencies not obtainable with flat PV counterparts.

2. Series Resistance:

At flux densities of about 50 to 100 $W/cm^2$, the series resistance of photovoltaic cells becomes the predominant loss mechanism and drives down the conversion efficiency. There are several components that contribute to the overall series resistance. For the sake of brevity, we mention here only three key components that are relevant in this comparison. The three key components are the series resistances of: (1) the metal grid path, (2) the bus-bar path, and (3) the emitter path. The grid resistance and bus-bar resistance are linearly dependent on the width and thickness of the respective metallization. Cells with wider grid- and bus bar units have lower series resistance. Emitter resistance is proportional to the distance between the fingers. The closer the fingers are, the lower is the emitter resistance. Thus, by making the fingers and bus-bar wider and the distance between the fingers smaller, the series resistance can be reduced. However, the photocells designed for flat panel PV receivers for concentrator systems are limited to relatively small finger widths and bus-bar widths and large distances between the fingers. This is because of the shading factor F=W/d, where W is the average finger and bus-bar width and d is the distance between the fingers. As seen from this definition, a wider metallization and a smaller finger distance increases the shading factor as a result of increased reflective losses.

An advantage of the PowerSphere 310 is that this effect is mitigated because of the photon recycling process explained above. Thus, the photovoltaic cells 316 for the PowerSphere 310 can have a much wider metallization width and closer fingers. This capability pushes the downturn of conversion efficiency towards much higher flux levels without the penalty of shadowing losses.

3. Flux Uniformity:

Flux uniformity across a high flux PV receiver is of outmost importance. A non-uniform flux that is impinging on a string of cells that are connected in series may force a cell into reverse bias if this cell receives less light than the neighboring cells in the string. The bias reversal occurs when the current in the string exceeds the short circuit current of that cell in question. This reverse bias condition increases the resistive power dissipation in the cell and causes the temperature to rise, thus forming a "hot spot". At high flux levels, such a hot spot very likely destroys the converter as a whole. The laser power beam profile at a flat plate receiver is naturally not uniform across the surface of the cell array. The flux density is high in the center and declines rapidly towards the edges. This is a major concern for flat plate PV receivers. On the other hand, the PowerSphere 310 of the present invention is equipped with a dielectric light injector 336 (as shown in FIG. 3), which eliminates this flux non-uniformity problem, since the extractor 336 of the dielectric light injector 320 distributes the light evenly in all directions as the light 318 travels towards the its tip. The result is that in the PowerSphere 310, the flux density across the cells 316 is substantially uniform for the entire cavity 314.

4. Operation in Pulse Mode:

The duty cycle of some lasers (with short pulse duration) may be much shorter than the carrier lifetime in the particular PV cells used. Although an average power output will be realized from the array as a whole, the cells must have a metal grid system that can handle the peak photo-current to minimize the resistive losses that are proportional to the peak current squared. The problem in the case of flat plate PV receivers is that high metallization coverage leads to excess shadowing losses. As discussed above, the PowerSphere 310 allows the use of highly enhanced metallization with minimal grid coverage losses. Hence, a PowerSphere system is more suitable to operate in pulse mode than a flat plate PV receiver.

5. Additional Features of the PowerSphere for Space Applications:

A key advantage of PowerSphere design for space applications is that the PV cells 316 are located inside the cavity 314 and are not exposed to the space environment. Assume a sphere 310 having a housing 312 made of beryllium or lightweight carbon composite with a thin exterior metal cladding. Such a conductive spherical structure in space provides highly improved space hardening for the PV cells 316. These hardening features protect the cells 316 against: (a) radiation damage by charged particles (particularly for Van Allen Belt-crossing missions), (b) space charging and power losses (Faraday Cage effect provides electro-statically shielding of the interior), (c) atomic oxygen, (d) space debris and meteor showers, (e) UV, (f) solar flares and magnetic storms, etc. As a result of these effective space-hardening features, some of the redundant, oversized beginning of life (BOL) array can be eliminated and the specific power [$/Watt] can be improved.

For terrestrial applications, the PowerSphere 310 offers extreme robustness against damaging environmental conditions, including sand storms, hail, acid rain, and salt spray.

The PowerSphere 310 of the present invention has the potential to yield laser-to-electricity conversion efficiencies from 60% to 70%. Thus, excluding any atmospheric losses, a finely tuned laser/PowerSphere system has the near-term potential to reach an electricity-to-electricity conversion efficiency in the order 24 to 2%, assuming that the electricity-to-laser energy conversion efficiency is 40%. If the primary energy source is a 50% efficient solar PVCC concentrator, such as disclosed and claimed in the parent patent (U.S. Pat. No. 6,689,949), then the overall solar-to-electricity conversion efficiency via solar-PVCC/laser-PowerSphere systems becomes 12% to 14%.

INDUSTRIAL APPLICABILITY

The concentrating photovoltaic module is expected to find increasing use in space and terrestrial-based photovoltaic power systems for converting laser radiation to electricity.

Thus, there has been disclosed a photovoltaic module for converting laser light to electrical power. It will be readily apparent to those skilled in this art that various changes and modifications of an obvious nature may be made, and all such changes and modifications are considered to fall within the scope of the present invention, as defined by the appended claims.

What is claimed is:

1. A photovoltaic module for converting radiation into electrical power, said module comprising:
   (a) a housing having a cavity of generally optimized closed shape inside said housing, said cavity having an internal surface area $A_s$ and including an opening or aperture for admitting said radiation into said cavity, said opening having an entrance aperture area $A_i$ that is substantially smaller than $A_s$; and
   (b) a plurality of single junction, or mufti-junction, or a combination of single and multi-junction photovoltaic cells within said cavity, at least some of said photovoltaic cells having different energy band-gaps to generate said electrical power in response to said radiation; and
   (c) a filter, associated with each photovoltaic cell, each filter tuned to the band gap of its associated photovoltaic cell comprising a Rugate filter or a combination of a stacked interference filter and a Rugate filter for admitting radiation corresponding to said band gap and reflecting radiation outside of said band gap, said reflected radiation being recycled within the cavity for conversion by cells having a corresponding band gap.

2. The photovoltaic module of claim 1 wherein each photovoltaic cell is provided with a back surface mirror for reflecting photons not absorbed by the photovoltaic cell on which said photons are incident.

3. The photovoltaic module of claim 1 wherein said photovoltaic cells have a given quantum efficiency selected to optimize the conversion of said radiation.

4. The photovoltaic module of claim 1 further comprising a concentrator system external of the cavity and proximate to the aperture for concentrating the radiation and producing and directing radiation so concentrated into the aperture.

5. The photovoltaic module of claim 4 wherein the concentrator system includes a primary concentrator for receiving the radiation and producing pre-focused radiation.

6. The photovoltaic module of claim 5 wherein said primary concentrator comprises a Cassegranian concentrator.

7. The photovoltaic module of claim 6 wherein said Cassegranian concentrator comprises a primary parabolic concentrator and a secondary hyperbolic concentrator.

8. The photovoltaic module of claim 5 further including means for transferring waste heat to a back surface of said primary concentrator for radiation into the surrounding environment.

9. The photovoltaic module of claim 5 wherein the concentrator system includes a secondary concentrator optically coupled to the aperture for receiving the pre-focused radiation and for directing and concentrating the pre-focused radiation through the aperture.

10. The photovoltaic module of claim 9 wherein said secondary concentrator includes inner surfaces that are mirrored.

11. The photovoltaic module of claim 9 wherein said secondary concentrator is a non-imaging, compound parabolic of hollow design.

12. The photovoltaic module of claim 9 wherein said secondary concentrator has a Bezier optimized contour to provide a combination of maximum acceptance angle, maximum concentration, and minimum height.

13. The photovoltaic module of claim 9 wherein said secondary concentrator is dielectric and further includes an integral extractor rod for guiding said light towards the center of said cavity and then to emit photons uniformly in all directions to provide angular isotropy of said photons.

14. The photovoltaic module of claim 1 wherein the ratio of $A_i$ to $A_s$ up to about 0.01.

15. The photovoltaic module of claim 1 wherein said photovoltaic cells have an optimized bandgap energy to respond to corresponding wavelengths within the radiation.

16. The photovoltaic module of claim 15 wherein said photovoltaic cells have a peak of quantum efficiency response matching said corresponding wavelengths.

17. A concentrating photovoltaic module for providing a concentration in the range of about 500 to over 1,000 suns and a power generation capacity in a range of a few to 50 kilo-Watts, said concentrating photovoltaic module comprising:

(a) a housing having a cavity of generally optimized closed shape inside said housing, said cavity having an internal surface area $A_s$ and including an opening for admitting pre-focused, direct solar radiation into said cavity, said opening having an entrance aperture area $A_i$ that is significantly smaller than $A_s$;

(b) a plurality of single junction or mufti-junction or both single junction and multi-junction solar cells within said cavity, at least some of said solar cells each having different energy bandgaps so that their spectral responses simultaneously fully span the solar spectrum; and (c) at least one filter associated with each solar cell each filter tuned to the band gap of its associated photovoltaic cell for admitting solar radiation corresponding to said band gap and reflecting radiation outside of said band gap, said reflected solar radiation being recycled within the cavity for conversion by cells having a corresponding band gap said filter comprising a Rugate filter or a combination of a stacked interference filter and a Rugate filter.

18. The concentrating photovoltaic module of claim 17 further comprising:

(1) a primary concentrator for intercepting and concentrating said solar radiation, and (2) a secondary concentrator for receiving said concentrating said solar radiation from said primary concentrator and further concentrating said solar radiation, said photovoltaic module positioned for receiving said further concentrated solar radiation from said secondary concentrator.

* * * * *